United States Patent
Lui et al.

(10) Patent No.: US 6,689,695 B1
(45) Date of Patent: Feb. 10, 2004

(54) MULTI-PURPOSE COMPOSITE MASK FOR DUAL DAMASCENE PATTERNING

(75) Inventors: Meng-Huei Lui, Taoyuan (TW); Mei-Hui Sung, Taoyuan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/184,790

(22) Filed: Jun. 28, 2002

(51) Int. Cl.[7] ............................................. H01L 21/311
(52) U.S. Cl. ........................ 438/700; 438/624; 438/701
(58) Field of Search ............................. 438/700, 638, 438/640, 701, 622, 624

(56) References Cited

U.S. PATENT DOCUMENTS

| | | | |
|---|---|---|---|
| 5,702,982 A | 12/1997 | Lee et al. ...................... 437/195 |
| 5,705,430 A | 1/1998 | Avanzino et al. ............. 437/195 |
| 6,042,999 A | 3/2000 | Lin et al. ...................... 430/316 |
| 6,074,942 A | 6/2000 | Lou ............................... 438/632 |
| 6,083,822 A | 7/2000 | Lee ............................... 438/624 |
| 6,100,184 A | * 8/2000 | Zhao et al. .................... 438/638 |
| 6,207,576 B1 | 3/2001 | Wang et al. ................... 438/706 |
| 6,207,577 B1 | 3/2001 | Wang et al. ................... 438/706 |
| 6,514,860 B1 | * 2/2003 | Okada et al. .................. 438/678 |
| 6,521,542 B1 | * 2/2003 | Armacost et al. ............. 438/712 |

OTHER PUBLICATIONS

IBM Tech. Discl. Bull. vol. 30, No. 7, pp. 128–129 (Dec. 1987). (Disclosure Text , 1 page only).*

* cited by examiner

Primary Examiner—Caridad Everhart
(74) Attorney, Agent, or Firm—George O. Saile; Stephen B. Ackerman; Douglas R. Schnabel

(57) ABSTRACT

A method is disclosed for forming dual damascene structures with a multi-purpose composite mask. The composite mask serves not only to prevent via poisoning, but also to improve the lithographic characteristics of forming a dual damascene structure. This is accomplished by using a mask comprising silicon-based as well as polymeric dielectric layers. Thus, one of the components of the composite mask, namely, the polymeric dielectric, makes it possible to protect the via openings by conformally covering the sidewalls of the via and, at the same time, by bringing controllability to the height of the protective dielectric in the via opening. In addition, because the polymeric dielectric also serves as the main plasma resisting layer during the trench etch, the required photoresist is much thinner; therefore, the lithography process window can be extended beneficially.

34 Claims, 4 Drawing Sheets

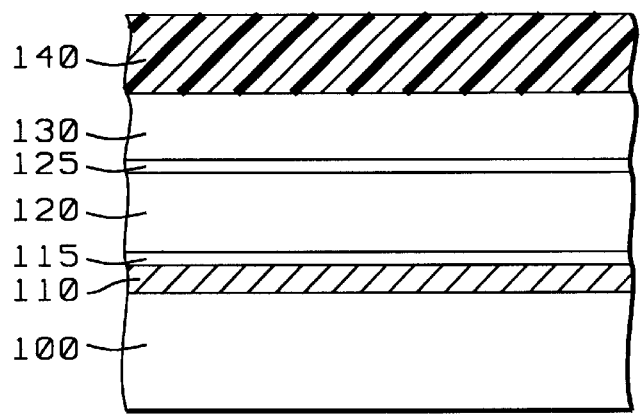
*FIG. 1a - Prior Art*
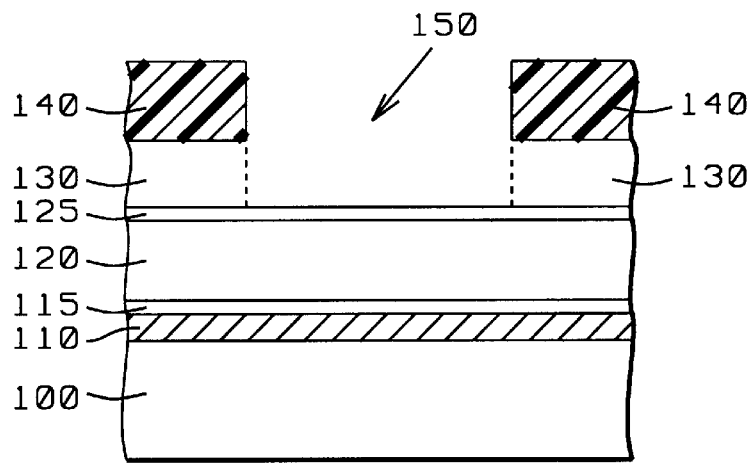
*FIG. 1b - Prior Art*
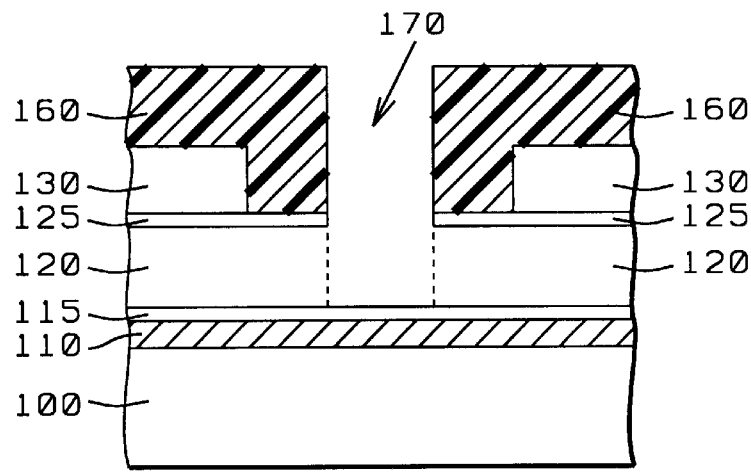
*FIG. 1c - Prior Art*

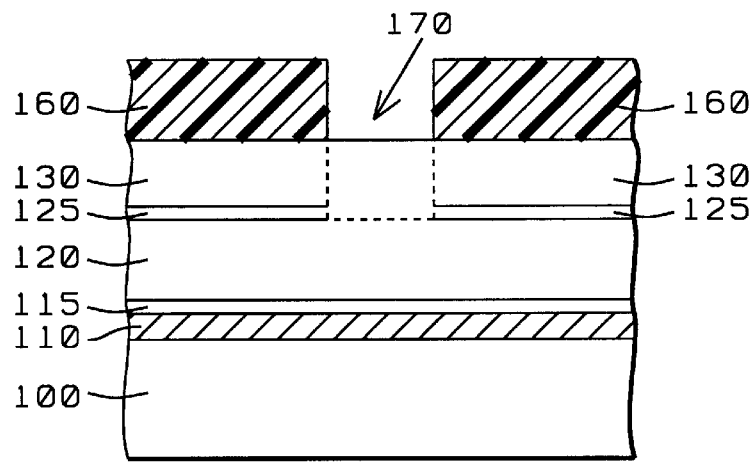
FIG. 1d – Prior Art
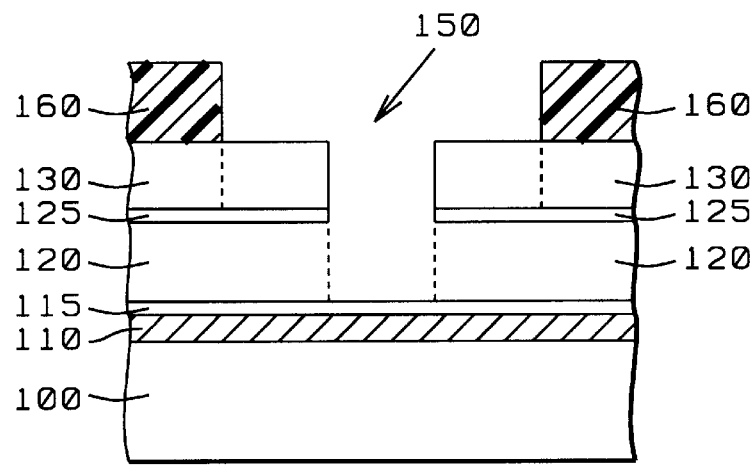
FIG. 1e – Prior Art
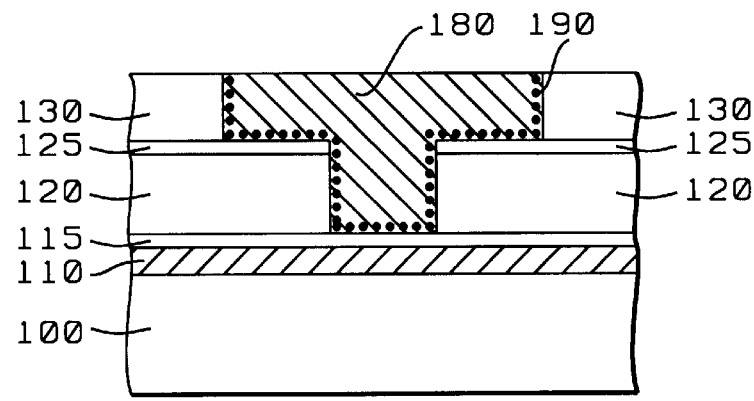
FIG. 1f – Prior Art

MULTI-PURPOSE COMPOSITE MASK FOR DUAL DAMASCENE PATTERNING

BACKGROUND OF THE INVENTION (1) Field of the Invention

The present invention relates to the manufacture of semiconductor devices in general, and in particular, to a method of dual damascene patterning using a multi-purpose composite mask.

(2) Description of the Related Art

In forming dual a damascene structure, via protection is important especially in using the via-first approach, which is explained more in detail below. In this via-first (or, counter-bore) approach, the typical via protection materials are organic, such as photoresist or anti-reflection coating (ARC). It is usually difficult to have a conformal filling of the via with this type of filler materials, especially for small geometry features where consistent filling height is sought. In addition, these organic materials react with the outgassing that occurs from the sidewalls of the vias, thus causing via poisoning. It is disclosed later in the embodiments of the present invention a method of alleviating these via filling problems.

The term 'damascene' is derived from a form of inlaid metal jewelry. In the context of integrated circuits it implies a patterned layer imbedded on and in another layer such that the top surfaces of the two layers are coplanar. Thus, in semiconductor manufacturing, trenches and holes in appropriate locations in the trenches are formed in an insulative material by etching, which are then filled with metal. Metal in trenches form the horizontal metal line interconnects while the metal in the underlying holes form the vertical connections to the layers of metal interconnects formed in the previous damascene structure.

Thus, in a single damascene semiconductor manufacturing process, incisions, or trenches, are formed in an insulative layer and filled with metal to form conductive lines. Dual damascene takes the process one step further in that, in addition to forming the trenches of a single damascene, hole openings are also formed at appropriate places in the trench further into the insulative layer. The resulting composite structure of trenches and holes are filled with metal. The process is repeated as many times as required to form the multi-level interconnections between metal lines and the holes formed therebetween.

In one approach for a dual damascene process shown in FIG. 1a, two insulative layers (120) and (130), sometimes referred to as intermetal dielectrics (IMD), are formed on a substrate (100) with an intervening etch-stop or trench-stop layer (125). Substrate (100) is provided with metal layer (110) and another etch-stop layer or via-stop liner (115). Metal layer can be the commonly used aluminum or copper, while the liner can be another dielectric layer. A desired trench or trench pattern (150) is first etched into the upper insulative material (130) using conventional photolithographic methods and photoresist (140). The etching stops on trench-stop layer (125). Next, a second photoresist layer (160) is formed over the substrate, thus filling the trench opening (150), and patterned with hole opening (170), as shown in FIG. 1b. The hole pattern is then etched into the lower insulative layer (120) as shown in FIG. 1c and photoresist removed, thus forming the dual damascene structure shown in FIG. 1f.

Or, the order in which the trench and the hole are formed can be reversed so that the hole is formed first, which is called the "via-first" process. The fact that the trench is formed later over the hole, the process is sometimes referred to as "counter-bore" as in forming a counter-bore for a screw. Thus, the upper insulative layer (130) is first etched, or patterned, with hole (170), as shown in FIG. 1d. The hole pattern is also formed into etch-stop layer (125). Then, the upper layer is etched to form trench (150) while at the same time the etching transfers the hole pattern in the etch-stop layer into lower insulation layer (120), as shown in FIG. 1e. It will be noted that trench-stop layer (125) stops the etching of the trench into the lower insulation layer. Similarly, via-stop layer (115) also stops etching. However, layer (115) at the bottom of opening (170) is removed before metal is deposited at the next step. Thus, after the completion of the thusly formed dual damascene structure, both the hole opening and trench opening are filled with metal (180), and any excess material on the surface of the substrate is removed by chemical mechanical polishing, as seen in FIG. 1f.

In prior art, various methods of forming damascene structures are described. In U.S. Pat. No. 6,074,942, Lou describes a method for forming a dual damascene contact and interconnect with the steps of: forming an insulating layer on a substrate; forming a nitride layer over said insulating layer; forming a cap oxide layer over said nitride layer; patterning and etching said insulating layer, nitride layer, and cap oxide layer to correspond to the location of said contacts; patterning and etching said nitride layer and said cap oxide layer to correspond to the pattern of said interconnects; and performing a reflow step.

In U.S. Pat. No. 6,083,822, Lee discloses a fabrication process for a copper dual damascene structure where a composite insulator layer, comprising silicon oxide layers, and multiple silicon nitride layers as stop layers are used. A method of forming a self-aligned dual damascene structure is described by Wang, et al., in U.S. Pat. Nos. 6,207,576 and 6,207,577. A nitride etch stop layer is formed on an oxide layer on a substrate, and a low k dielectric layer is formed on the nitride etch stop layer. A trench is etched into the low k dielectric layer, followed by the etching of a via into the oxide dielectric layer. The oxide dielectric material and low k dielectric material are selected so that they have different sensitivity to at least one etchant chemistry. Undercutting in the second dielectric layer caused by over etching is prevented during the etching of the via in the second dielectric layer by employing an etch chemistry that etches only the oxide dielectric material and not the low k dielectric material.

In another U.S. Pat. No. 6,042,999 by Line, et al., a robust damascene process is disclosed where the substructure in a substrate is protected from damage caused by multiple etchings required in a damascene process by filling a contact or via hole opening with a protective material prior to the forming of the conductive line opening of the damascene structure having an etch-stop layer separating a lower and an upper dielectric layer. In a first embodiment, the protective material is partially removed from the hole opening reaching the substructure prior to the forming of the upper conductive line opening by etching. In the second embodiment, the protective material in the hole is removed at the same time the upper conductive line opening is formed by etching. In a third embodiment, the disclosed process is applied without the need for an etch-stop layer.

A dual damascene with a sacrificial via fill is described in U.S. Pat. No. 5,705,430 by Avanzino, et al. A first layer of insulating material is formed with via openings. The openings are filled with a sacrificial removable material. A second layer of insulating material is deposed on the first layer. In one embodiment, the etch selectivity to the etchant of the second layer is essentially the same as the sacrificial via fill and is substantially higher than second layer. Using a conductive line pattern aligned with the via openings, conductive line openings are etched in the second insulating layer and, during etching. The sacrificial fill is removed from the via openings. In a second embodiment, the sacrificial material is not etchable by the etchant for forming the conductive line openings and, after formation of the conductive line openings, the sacrificial material is removed with an etchant to which the first insulating layer is resistive or less selective. A conductive material now is deposited in the conductive line and via openings.

A method for making metal interconnections and buried metal plug structures for multilevel interconnections on semiconductor integrated circuits is disclosed in U.S. Pat. No. 5,702,982. The method utilizes a single patterned photoresist layer for etching trenches in an insulating layer, while at the same time protecting the device contact areas in the contact openings from being etched, thereby reducing process complexity and manufacturing cost. After the trenches are formed, die patterned photoresist layer and the photoresist in the contact openings are removed by plasma ashing and a metal layer is deposited and etched back or chemical-mechanical polished to form concurrently the metal interconnections and the buried metal plug contacts. The surface of the metal interconnections is coplanar with the insulating surface, thereby allowing the process to be repeated several times to complete the necessary multilevel of metal wiring needed to wire-up the integrated circuits while maintaining a planar surface.

A different method of forming a damascene structure is disclosed later in the embodiments of the present invention where some of the prior art problems of filling vias are alleviated.

SUMMARY OF THE INVENTION

It is therefore an object of this invention to provide a method of forming a multi-purpose composite mask for patterning dual damascene structures.

It is another object of the present invention to provide a method of using certain dielectric materials in order to achieve conformally filled via openings, especially those with small geometry features, in order to prevent via poisoning resulting from outgassing from unprotected walls of the openings.

It is yet another object of the present invention to provide a method of forming a composite mask for serving not only to prevent via poisoning, but for the multi-purpose of also improving the lithographic characteristics of forming a dual damascene structure.

It is still another object of the present invention to provide a method for better controlling the conformity on the sidewalls as well as the height in the via opening of the via protection material in order to improve the characteristics of the resulting dual damascene structure.

These objects are accomplished by providing a substrate having a stack of dielectric layers comprising a barrier layer, a first dielectric layer, an etch-stop layer, a second dielectric layer and a cap layer formed thereon in said order; forming a via opening in said stack of dielectric layers; forming a polymeric dielectric layer over said substrate, including over said via opening; forming a silicon based dielectric layer over said polymeric dielectric layer; patterning said silicon based and polymeric dielectric layers to define a trench opening, and partially removing said polymeric dielectric layer from said via opening; using said polymeric dielectric as a via protector, etching further said trench opening until said etch-stop layer is reached; and leaning any remaining polymeric dielectric in said via to complete the forming of said dual damascene structure.

BRIEF DESCRIPTION OF THE DRAWINGS

FIGS. 1a–1c show the forming of a dual damascene structure where a trench opening is etched first into an upper second dielectric layer until an etch-stop layer is reached, and then the hole pattern etched into the lower first dielectric layer, according to prior art.

FIGS. 1d–1e show the forming of a dual damascene structure with "via-first", or, "counter-bore" approach where a via opening is etched first into an upper second dielectric layer until an etch-stop layer is reached, and then the trench opening etched into the top layer while at the same time the via opening is transferred into the lower first dielectric layer, according to prior art.

FIG. 1f shows a dual damascene structure formed by either one of the methods shown in FIGS. 1a–1c or FIGS. 1d–1e, according to prior art.

DESCRIPTION OF THE PREFERRED EMBODIMENTS

Figure 2A:
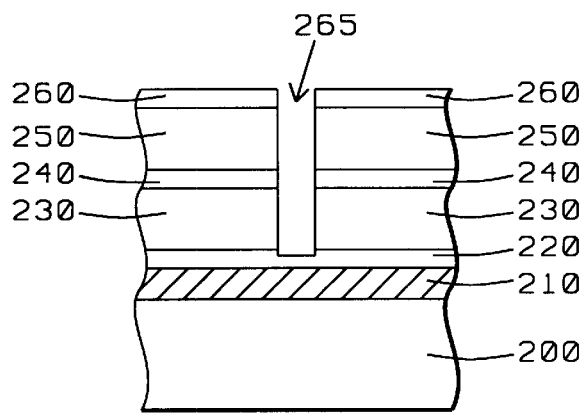
FIG. 2a is a partial cross-sectional view of a substrate showing the forming of a via opening in a stack of dielectric layers on the substrate, according to the present invention.

Referring now to the drawings, FIGS. 2a–2f, there is shown a method of forming a composite mask in order to prevent via poisoning, as well as for the multi-purpose of improving the lithographic characteristics in the forming of a dual damascene structure. This is accomplished by using a mask comprising silicon-based as well as polymeric dielectric layers. Thus, one of the components of the composite mask, namely, the polymeric dielectric, makes it possible to protect the via openings by conformally covering the sidewalls of the via and, at the same time, by bringing controllability to the height of the protective dielectric in the via opening. In addition, because the polymeric dielectric also serves as the main plasma resisting layer during the trench etch, as disclosed below, the required photoresist is much thinner, thereby alleviating the lithography process loading.

More specifically, FIG. 2a shows a portion of a semiconductor substrate (200), which is preferably silicon having an intermetal dielectric (IMD) layer formed on a substructure of gates and interlevel dielectric layers (ILD) already formed thereon. It will be understood by those skilled in the art that IMD layers are formed between metal layers which are formed after forming an ILD layer over polysilicon gates and before first metal layer is formed. In FIG. 2a, the substrate is provided with a metal layer (210) and dielectric layer (220) which serves as a diffusion barrier to the underlying metal layer. The barrier layer protects the pre-existing interconnect layer (210) from oxidation or corrosion during later process steps. The interconnect metal is preferably copper with a thickness between about 2000 to 7000 Å, and the barrier layer comprises nitride or carbide with a thickness between about 300 to 1000 Å, which can also serve as an etch-stop layer.

A low-k dielectric material with a dielectric constant less than 4.0 is next spun over, or grown over the barrier layer to form layer (230), as shown in FIG. 2a. Some of the conventional low-k materials include black diamond, while some others are usually fluorinated, such as the amorphous fluorinated carbon (α-C:F), poly-tetra-fluoro-ethylene (PTFE), fluorinated polyimide, fluorinated or $SiO_2$, phosphosilicate glass (PSG). Some others, such as benzocyclobutene (BCB), hydrogen silsesquioxane (HSQ) or the material known as FLARE manufactured by Allied Signal or SILK manufactured by Dow Chemical have even lower dielectric constants. In the preferred embodiment, the low-k dielectric is black diamond having a thickness between about 2000 to 6000 Å. It will be understood that dielectric layer (230) can also comprise an organic low-k material, such as BCB, FLARE, and SILK, and a chemical vapor deposited (CVD) oxide, the combination called a "hybrid low-k" dielectric having a thickness between about 2000 to 6000 Å, where the top organic layer has a thickness between about 1000 to 5000 Å and the lower CVD oxide layer has a thickness between about 200 to 1000 Å.

In many cases, these low-k materials are incompatible with conventional photoresist stripping using oxygen ashers or solvents. Thus, the patterning of the low-k materials to form the trenches and vias of a damascene formation is a difficult task due to this incompatibility of the low-k materials with conventional photoresist stripping. That is, in most cases, the low-k etch chemistry etches the photoresist at approximately the same rate as the low k dielectric. It is, therefore, a key aspect of the present invention to use a hard mask which would have a low loss when etching the low-k dielectric. For this purpose, a full stack of high selectivity material, preferably, selected from a group consisting of nitride, oxynitride, carbide and other high oxide etch selectivity materials is used, having a thickness between about 200 to 1000 Å. Thus, layer (240) is used as a hard mask to pattern low-k dielectric layer (230) with an organic etch.

A third dielectric layer (240), which also serves as an etch-stop layer, is formed over layer (230). Preferably layer (240) is nitride or carbide and has a thickness between about 10 to 1000 Å. Dielectric layer (250) is also a low-k material, similar to layer (230), and has a thickness between about 2000 to 6000° C. Next dielectric layer (260), serving as a cap layer, alto comprises nitride or carbide having a thickness between about 200 to 1000 Å.

A first photoresist layer, not shown, is formed over the substrate including over the stack of five dielectric layers (220) through (260) shown in FIG. 2a. Then, using the "via-first" or "counter-bore" approach, the photoresist is patterned with a via hole, and via hole (265) is etched through the stack of dielectric layers reaching first dielectric layer (220) as shown in the same FIG. 2a. The etching is accomplished with a recipe comprising $C_xF_y$, $N_2$, $O_2$.)

After the first via etch, trench etch is performed next. However, as a main feature and key aspect of the instant invention, multi-dielectric deposition is used to form a multi-purpose mask prior to etching the trench. Namely, a polymeric dielectric layer (270), preferably SiLK by Dow Chemical is first spun on the substrate to a thickness between about 1000 to 5000 Å. It will be noted that the spun-on polymer over the substrate fills via opening (265) completely, and it especially has the property of filling conformally and well small openings in high scale integration of sub-micron technologies. Because of its conformal filling capabilities, it will be apparent at a later step that it will be possible to retain a portion of the polymeric dielectric in the via opening as a protective cover during the subsequent process steps.

Figure 2B:
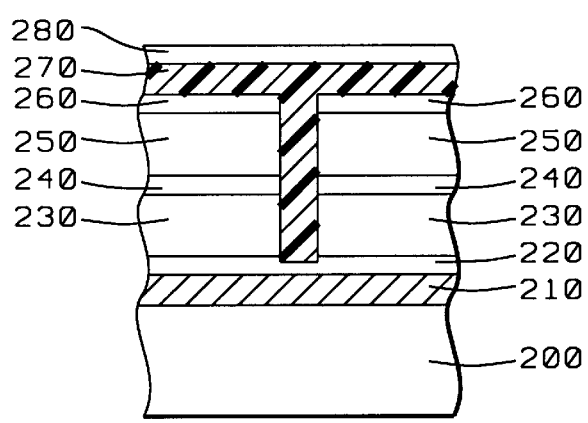
FIG. 2b is a partial cross-sectional view of a substrate showing the forming of a composite mask, according to the present invention.
Figure 2C:
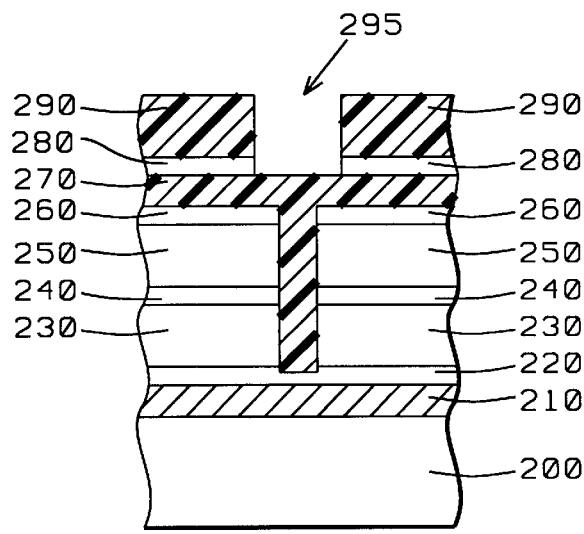
FIG. 2c is a partial cross-sectional view of a substrate showing the patterning of a trench opening in a photoresist, according to the present invention.

At the next step, silicon-based dielectric layer (280) is deposited over layer (270) as shown in FIG. 2b. It is preferred that layer (280) is selected from a group consisting of silicon oxynitride (SiON), silicon nitride (SiN) and $SiO_x$, and that it has a thickness between about 200 to 1000 Å. Then photoresist layer (290) is formed over the silicon-based dielectric layer to perform trench photolithography. It will be noted that because of the underlying composite mask comprising silicon-based and polymeric layers (280) and (2870), respectively, the required thickness of photoresist layer (290) is only between about 1000 to 3000 Å so that, thereby alleviating the well-known lithography process loading, that is, extending the lithography process window.

Figure 2D:
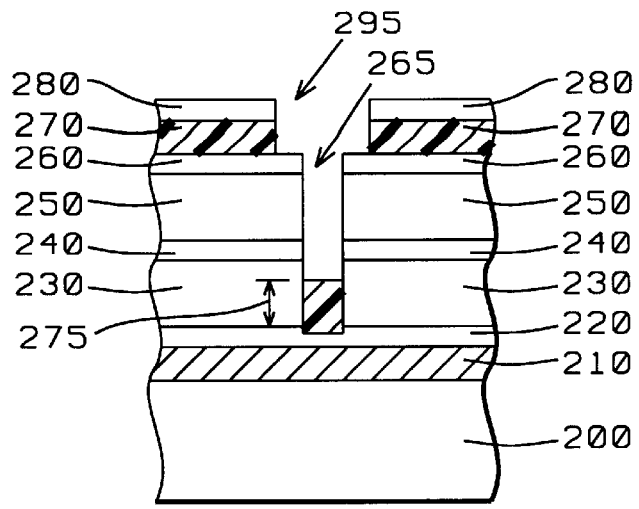
FIG. 2d is a partial cross-sectional view of a substrate showing the forming of the trench opening of FIG. 2c in the composite mask of the same substrate, according to the present invention.
Figure 2E:
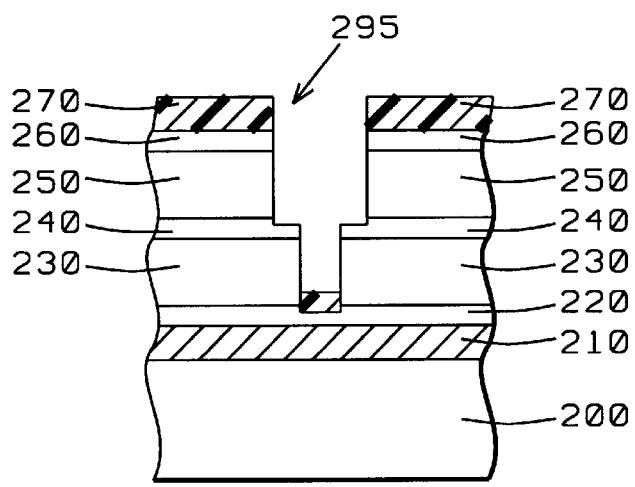
FIG. 2e is a partial cross-sectional view of a substrate showing the transfer of the trench opening in the composite mask of FIG. 2d into the fourth dielectric layer of the substrate, according to the present invention.

The photoresist is then patterned with trench opening (295) (shown in FIG. 2c) and the opening is etched into the underlying silicon-based layer (280) which will be used as a hard mask for etching the trench opening into the low-k dielectric layer on the substrate. However, first, the trench pattern is defined in the polymeric dielectric by etching the pattern using an oxygen, ($O_2$) or nitrogen/hydrogen ($N_2/H_2$) based plasma etch, as shown in FIG. 2d. At the same time, a portion of the polymeric dielectric is left in via opening (265). It is very critical that height (275) of the remaining portion is between about 1000 to 4000 Å so that when the trench etch is performed at the next step, the corner edge of the via will avoid, what is called "polymer fence" and not be faceted, that is, it will have a well defined corner. Also, the presence of the polymeric dielectric in the via provides protection from via poisoning that would otherwise be caused by the interaction between the outgassing from the sidewalls of the via and the photoresist.

Figure 2F:
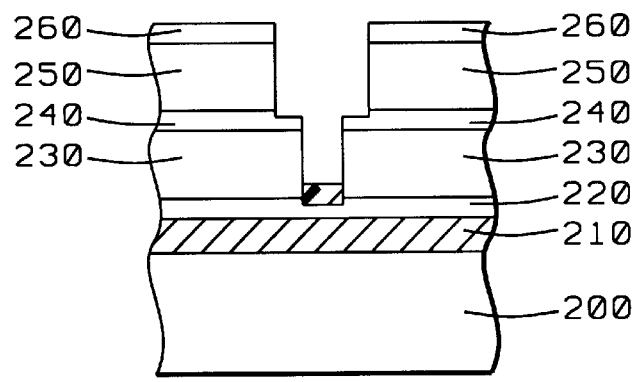
FIG. 2f is a partial cross-sectional view of a substrate showing the completion of the dual damascene structure of this invention after the removal of the residual polymer from the via of FIG. 2e, according to the present invention.

Thus, using the composite mask of layers (280) and (270) as a hard mask, at the next step, trench etch is performed with a recipe comprising $C_xF_y$, $N_2$, $O_2$ such that trench opening (295) is transferred into dielectric layer (250) comprising low-k material and stopping on middle etch-stop layer (240). Subsequently, any polymeric dielectric material remaining in the via opening is removed, that is cleaned up completely by using oxygen plasma ashing as shown in FIG. 2f. The dual damascene structure so completed is now ready for further processing to fill with metal to form the desired interconnect to the underlying first metal layer, layer (210).

Though these numerous details of the disclosed method are set forth here, such as process parameters, to provide an understanding of the present invention, it will be obvious, however, to those skilled in the art that these specific details need not be employed to practice the present invention. At the same time, it will be evident that the same methods may be employed in other similar process steps that are too many to cite, such as in filling vias with other polymers having good filling properties.

While the invention has been particularly shown and described with reference to the preferred embodiments thereof, it will be understood by those skilled in the art that various changes in form and details may be made without departing from the spirit and scope of the. invention.

What is claimed is:

1. A method of forming a multi-purpose composite mask for dual damascene patterning comprising the steps of:

providing a substrate having a stack of dielectric layers comprising a barrier layer, a first dielectric layer, an etch-stop layer, a second dielectric layer and a cap layer formed thereon in said order wherein said first dielectric layer comprises a low-k material including black diamond;

forming a via opening in said stack of dielectric layers;

forming a polymeric dielectric layer over said substrate, including over said via opening;

forming a silicon based dielectric layer over said polymeric dielectric layer;

patterning said silicon based and polymeric dielectric layers to define a trench opening, and partially removing said polymeric dielectric layer from said via opening;

using said polymeric dielectric as a via protector, etching further said trench opening until said etch-stop layer is reached; and cleaning any remaining polymeric dielectric in said via to complete the forming of said dual damascene structure.

2. The method according to claim 1, wherein said barrier layer comprises nitride or a carbide.

3. The method according to claim 1, wherein said barrier layer has a thickness between about 200 to 1000 Å.

4. The method according to claim 1, wherein said first dielectric has a thickness between about 2000 to 6000 Å.

5. The method according to claim 1, wherein said etch-stop layer comprises nitride or carbide.

6. The method according to claim 1, wherein said etch-stop layer has a thickness between about 200 to 6000 Å.

7. The method according to claim 1, wherein said second dielectric layer comprises a low-k material including black diamond.

8. The method according to claim 1, wherein said second dielectric has a thickness between about 2000 to 6000 Å.

9. The method according to claim 1, wherein said cap layer comprises nitride or carbide.

10. The method according to claim 1, wherein said cap layer has a thickness between about 200 to 1000 Å.

11. The method according to claim 1, wherein said via opening is accomplished with an etch recipe comprising CxFy, N2, and O2.

12. The method according to claim 1, wherein said polymeric dielectric layer has a thickness between about 1000 to 5000 Å.

13. The method according to claim 1, wherein said silicon based dielectric layer comprises SiON, SiN, or siOx.

14. The method according to claim 1, wherein said silicon based dielectric layer has a thickness between about 200 to 1000 Å.

15. The method according to claim 1, wherein said patterning to define said trench opening is accomplished with a recipe comprising O2 or N2/H2 based plasma.

16. The method according to claim 1, wherein said etching further said trench opening until said etch-stop layer is reached is accomplished with a recipe comprising CxFy, N2, and O2.

17. The method according to claim 1, wherein said cleaning said remaining polymeric dielectric is accomplished by oxygen plasma ashing.

18. A method of forming a multi-purpose composite mask for dual damascene patterning comprising the steps of:

providing a substrate having a first metal layer formed thereon;

forming a first dielectric layer over said first metal layer;

forming a second dielectric layer over said first dielectric layer wherein said second dielectric layer comprises a low-k material including black diamond;

forming a third dielectric layer over said second dielectric layer;

forming a fourth dielectric layer over said third dielectric layer;

forming a fifth dielectric layer over said fourth dielectric layer;

forming a via opening starting from said fifth dielectric layer until reaching to and stopping on said first dielectric layer on said substrate;

forming a polymeric dielectric layer over said substrate, including over said via opening;

forming a silicon based dielectric layer over said polymeric dielectric layer;

patterning said silicon based dielectric layer to define a hard mask for trench opening;

using said silicon based dielectric layer as a hard mask, etching to transfer said trench opening into said polymeric dielectric layer, while at the same time leaving a portion of said polymeric dielectric in said via opening;

using said silicon based and polymeric dielectric layers as a mask, further trench etching the underlying said fifth and fourth dielectric layers until stopping on said third dielectric layer; and removing said portion of said polymeric dielectric from the bottom of said via opening until said first dielectric via is reached, and said dual damascene structure is formed.

19. The method according to claim 18, wherein said first dielectric layer is a barrier layer comprising nitride or a carbide.

20. The method according to claim 18, wherein said first dielectric layer has a thickness between about 200 to 1000 Å.

21. The method according to claim 18, wherein said second dielectric has a thickness between about 2000 to 6000 Å.

22. The method according to claim 18, wherein said third dielectric layer is an etch-stop layer comprising nitride or carbide.

23. The method according to claim 18, wherein said third dielectric layer has a thickness between about 200 to 1000 Å.

24. The method according to claim 18, wherein said fourth dielectric layer comprises a low-k material including black diamond.

25. The method according to claim 18, wherein said fourth dielectric has a thickness between about 2000 to 6000 Å.

26. The method according to claim 18, wherein said fifth dielectric layer is a cap layer comprising nitride or carbide.

27. The method according to claim 18, wherein said fifth dielectric layer has a thickness between about 200 to 1000 Å.

28. The method according to claim 18, wherein said via opening is accomplished with an etch recipe comprising CxFy, N2, and O2.

29. The method according to claim 18, wherein said polymeric dielectric layer has a thickness between about 1000 to 5000 Å.

30. The method according to claim 18, wherein said silicon based dielectric layer comprises SiON, SiN, or SiOx.

31. The method according to claim 18, wherein said silicon based dielectric layer has a thickness between about 200 to 1000 Å.

32. The method according to claim 18, wherein said patterning to define for said trench opening is accomplished with a recipe comprising O2 or N2/H2 based plasma.

33. The method according to claim 18, wherein said further trench etching until stopping on said third dielectric layer is accomplished with a recipe comprising CxFy, N2, and O2.

34. The method according to claim 18, wherein said removing said portion of said polymeric dielectric is accomplished by oxygen plasma ashing.

* * * * *